United States Patent [19]

Matsuoka et al.

[11] Patent Number: 4,668,582
[45] Date of Patent: May 26, 1987

[54] THIN FILM EL PANEL

[75] Inventors: Tomizo Matsuoka, Neyagawa; Masahiro Nishikawa, Amagasaki; Yosuke Fujita, Ashiya; Atsushi Abe, Ikoma; Tsuneharu Nitta, Katano, all of Japan

[73] Assignee: Matsushita Electric Industrial Co., Ltd., Kadoma, Japan

[21] Appl. No.: 713,597

[22] Filed: Mar. 19, 1985

[30] Foreign Application Priority Data

Mar. 23, 1984 [JP] Japan .................................. 59-56954
Jul. 20, 1984 [JP] Japan ................................ 59-149620

[51] Int. Cl.⁴ ........................ B32B 9/00; B32B 19/00; H01J 1/62; H01J 63/04
[52] U.S. Cl. .................................... 428/690; 428/691; 428/917; 313/503; 313/509
[58] Field of Search ................ 313/503, 509; 428/690, 428/691, 917

[56] References Cited

U.S. PATENT DOCUMENTS

| | | |
|---|---|---|
| 3,560,784 | 2/1971 | Steele . |
| 3,728,594 | 4/1973 | Yim et al. ........................ 313/503 X |
| 3,775,631 | 11/1973 | Morikawa . |
| 3,854,070 | 12/1974 | Vlasenko et al. ................ 313/509 X |
| 4,099,091 | 7/1978 | Yamazoe et al. ..................... 313/509 |
| 4,213,074 | 7/1980 | Kawaguchi et al. ................ 313/509 |
| 4,373,145 | 2/1983 | McCarthy et al. ................. 313/503 |
| 4,394,601 | 7/1983 | Takeda et al. ...................... 313/509 |

FOREIGN PATENT DOCUMENTS

| | | | |
|---|---|---|---|
| 0119890 | 9/1979 | Japan ................................. 313/509 |
| 0116891 | 9/1979 | Japan ................................. 313/509 |
| 1543233 | 3/1979 | United Kingdom ................ 428/917 |
| 2109161 | 5/1983 | United Kingdom . |

OTHER PUBLICATIONS

Okamoto, K., et al; Low-Threshold-Voltage Thin--Film Electroluminescent Devices, pp. 698–702; *IEEE--Transactions on Electron Devices*, vol. Ed–28, No. 6, Jun. 1981; Japan.

Yang, K. W., et al; Studies of Temperature Effects in AC Thin-Film El Devices; pp. 703–708; *IEEE-Transactions on Electron Devices*, vol. Ed–28, No. 6, Jun. 1981; Oregon, USA.

*Primary Examiner*—Nancy A. Swisher
*Attorney, Agent, or Firm*—Cushman, Darby & Cushman

[57] ABSTRACT

New black color insulator thin films comprising Pr oxide, composite oxides of Pr-Mn, Pr-Ni, Pr-Co or Mn oxide are used to constitute at least one part or all parts of interface film between a phosphor film and a back electrode film of an AC thin film EL panel; and the panel with such a high contrast as 5:1 even at an illumination of 400 lux has been obtained.

6 Claims, 6 Drawing Figures

F I G. 1
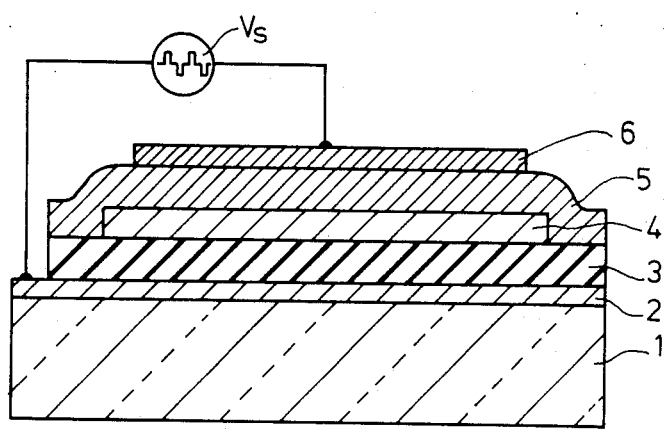
F I G. 2
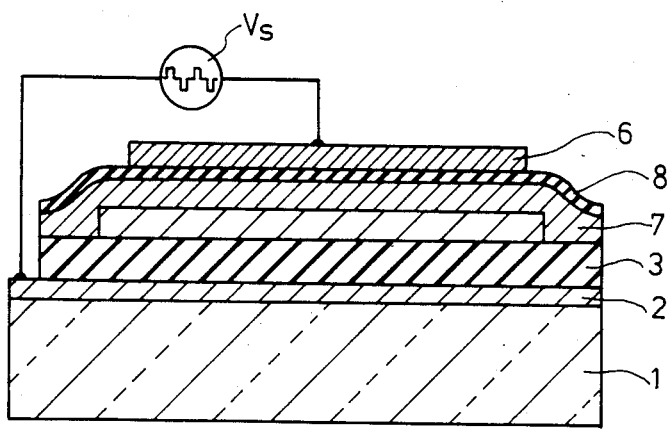

4,668,582

THIN FILM EL PANEL

BACKGROUND OF THE INVENTION

1. Field of the Invention

The present invention relates generally to an improvement in an EL panel, and particularly concerns a thin film EL panel which is suitable for AC operation. The improved EL panel is configurated very thin and of good viewing capability, and is suitable for graphic and character terminal display apparatus of a computer or the like.

2. Description of the Prior Art

Generally speaking, an EL panel has such a configuration as having on a glass substrate, a transparent electrode such as solid solution oxide of In and Sn, i.e., ITO, a first insulator film, a phosphor film, a second insulator film and a back electrode which is generally of Al, wherein other film than Al film are transparent layers. Accordingly, when viewed through the glass substrate, the laminated thin films being transparent, the light incident through the glass substrate is reflected by the inside surface of the aluminum electrode, thereby making the panel like a mirror.

The case where the incident light is normal to the panel face is described. Among the incident light, about 8% is reflected by the films before the Al electrode; and of the remaining light of 92% of the incident light, for instance, 90% is reflected. As a result, the overall reflectivity of the panel becomes about 91%. In the actual panel, due to absorptions in the thin films and scatterings at interfaces, some percentage of light is further lost, and accordingly the overall reflectivity is about 80-90%. Accordingly, in the conventional EL panel having an average brightness of 100 nit at no incident light shows a considerable brightness-up when viewed in a fairly bright room, for instance at illumination of 400 lux when the incident light and the reflected light are normal to the panel surface, the incident light of about 400 lux is almost reflected thereby undesirable adding the brightness to the black level of about 100 nit, (corresponding to the brightness of the picture elements of black level). As a result of the above-mentioned high reflection, the contrast of the EL panel as display device becomes such low as about 2:1, while a contrast of 5:1 or more is desirable for an EL panel even at the illumination of about 400 lux.

In order to improve the contrast of an EL panel, such proposals are made as arranging a circular polarization filter in front of the EL panel or providing a black insulator film between a phosphor layer and a back electrode. The former measure of using the circular polarization filter has a shortcoming of decreasing the brightness by about 60% and besides it is expensive. In the latter measure, though the brightness is decreased by about 50% the cost is low and practical, but the problem of the latter measure is a difficulty of obtaining black colored thin insulator film. Generally speaking, the black thin insulator film of the EL panel is requested to have a high sheet resistance of above $10^8 \Omega/\square$, and that light transmittance is preferably as small as substantially 0% for light of visible range, and dielectric constant thereof is preferably as high as possible in order to decrease driving voltage of the EL panel. However, such black thin insulator film has not yet been available so far.

SUMMARY OF THE INVENTION

The purpose of the present invention is to provide an improved thin film EL panel suitable for AC operation, with a higher contrast, in comparison with the conventional ones.

The improved thin film EL panel is provided by locating a new black thin insulator film between a phosphor layer and a back electrode, for effective absorption of the ambient light for attainment of higher contrast.

A thin film EL panel in accordance with the present invention comprises a transparent electrode film, a phosphor film formed above the transparent electrode film, a thin insulator film which is formed on the phosphor film and at least a part thereof is a thin film of an oxide selected from a group consisting of Pr oxide, composite oxides of Pr-Mn, Pr-Co and Pr-Ni and Mn oxide, and a back electrode formed on the thin insulator film.

BRIEF DESCRIPTION OF THE DRAWING

FIG. 1 is a sectional elevation view of a first embodiment of a thin film EL panel embodying the present invention.

FIG. 2 is a sectional elevation view of a second embodiment of a thin film EL panel embodying the present invention.

DESCRIPTION OF THE PREFERRED EMBODIMENT

Figure 3:
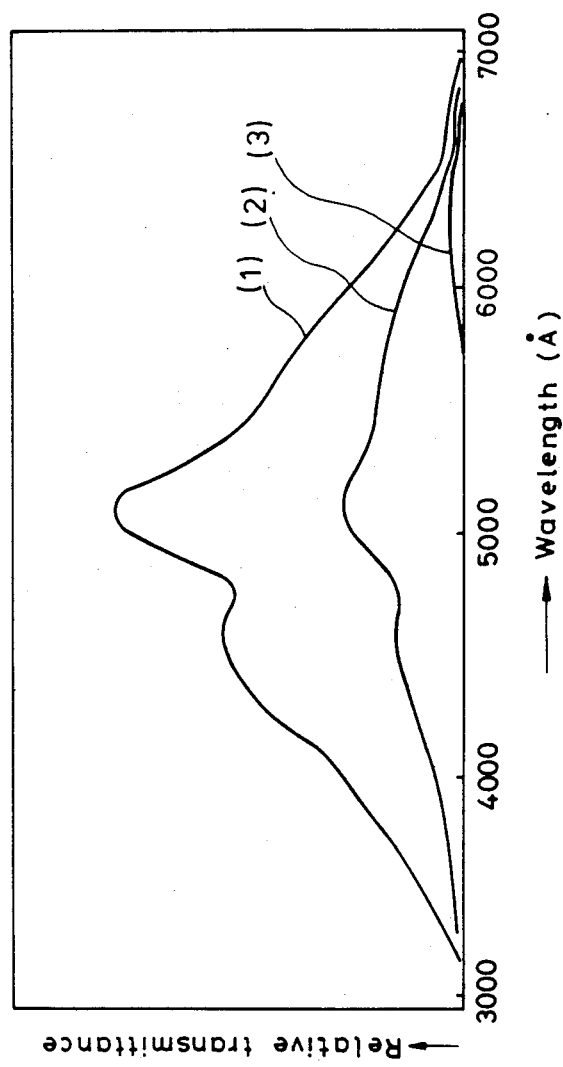
FIG. 3 is a graph of spectral distribution of light transmittance of Pr oxide thin insulator film.

FIG. 1 shows a configuration of a first preferred embodiment of a thin film EL panel using a black thin insulator film, wherein on a glass substrate 1, an ITO (In-Sn solid solution oxide) film 2 is formed, and thereon a first insulator film 3 of, for instance, $SrTiO_3$ is formed. On the first insulator film 3, a known EL phosphor film 4 is formed, and further thereon a black thin insulator film 5, which is characteristic in the present invention, is formed. The black thin insulator film 5 works as a second insulator film for driving the EL phosphor film 4, and at the same time serves as a black background layer for increasing contrast. On the black insulator film 5, a known Al-electrode 6 is formed.

FIG. 2 shows another embodiment of a thin film EL panel in accordance with the present invention wherein on a glass substrate 1, an ITO film as a transparent electrode is formed, and further thereon a first insulator film 3 of, for instance, $SrTiO_3$ is formed. And further on the first insulator film 3, a known EL phosphor layer 4 is formed, and further thereon a black insulator film 7, which is characteristic in the present invention, is formed, and still further thereon another insulator film 8, for instance, $BaTa_2O_6$ is formed, thereby forming a double layered second insulator coating together with the black insulator film to strengthen insulation function. A known Al back electrode 6 is formed on the additional insulator film 8.

Hereafter forming method and characteristic of the black insulator film 7 used in the thin film EL panel in accordance with the present invention is elucidated in detail.

A thin insulator film of Pr oxide can be formed by radio-frequency sputtering method or by electron beam method (EB method).

First, the radio-frequency sputtering method is elucidated. The Pr oxide is usually available as a compound having a composition of $Pr_6O_{11}$ or as metal Pr. The Pr oxide thin film could be formed by active sputtering in oxygen atmosphere using a metal target, but more inexpensive way was to use a spattering target prepared by sintering powder of the above-mentioned Pr-oxide ($Pr_6O_{11}$) in the air at about 1380° C. for 2 hours, thereby to form a sintered disk of about 5 mm thickness. Then by utilizing a radio-frequency magnetron spattering apparatus, and by changing temperature of the substrate, mixing ratio of Ar gas and $O_2$ gas and gas pressure in various ways, thin films of Pr oxide were formed on the glass substrate. Then, light absorption coefficients efficients were measured by changing the above-mentioned parameters, and the measured results are shown in Table 1.

TABLE 1

| No. | $O_2$/Ar ratio | Gas pressure Torr | Substrate temperature C.° | Absorption coefficient (cm$^{-1}$) | | |
|---|---|---|---|---|---|---|
| | | | | $\lambda =$ 4000Å | $\lambda =$ 5000Å | $\lambda =$ 6000Å |
| 1 | Ar only | $3 \times 10^{-2}$ | 200 | $1.4 \times 10^5$ | $9.5 \times 10^4$ | $6.2 \times 10^4$ |
| 2 | 1/3 | $3 \times 10^{-2}$ | 200 | $1.9 \times 10^5$ | $1.1 \times 10^5$ | $6.2 \times 10^4$ |
| 3 | 1/1 | $3 \times 10^{-2}$ | 200 | $2.9 \times 10^5$ | $2.1 \times 10^5$ | $1.3 \times 10^5$ |
| 4 | 1/1 | $3 \times 10^{-2}$ | 100 | $1.7 \times 10^5$ | $1.1 \times 10^5$ | $5.2 \times 10^4$ |
| 5 | 1/1 | $3 \times 10^{-2}$ | 340 | $2.7 \times 10^5$ | $1.9 \times 10^5$ | $1.2 \times 10^5$ |
| 6 | $O_2$ only | $3 \times 10^{-2}$ | 200 | $2.9 \times 10^5$ | $2.4 \times 10^5$ | $1.6 \times 10^5$ |
| 7 | $O_2$ only | $9 \times 10^{-2}$ | 200 | $5.0 \times 10^5$ | $4.0 \times 10^5$ | $1.8 \times 10^5$ |

As is obvious from the Table 1, satisfactory absorption coefficient comparable to fundamental absorptions of Si and GaAs, which are of the order of $10^5$ cm$^{-1}$ at the wavelength $\lambda = 5000$ Å namely the central part of the visible light wavelengths, is obtainable when an oxidizing atmosphere containing $O_2$ in Ar is used and the processes are carried out in a high gas pressure. For the substrate temperature, about 200° C. was most suitable. Crystal phase was examined by means of X-ray diffraction, and it was found that when the gas atmosphere was only Ar the resultant oxide became almost $Pr_6O_{11}$, while when only $O_2$ was used as the atmosphere the resultant film consisted of a phase of almost $PrO_2$ with small amount of $Pr_6O_{11}$; that is to say, as the oxygen partial pressure increases the ratio of $PrO_2$ becomes larger. Also it was revealed that when the content of $PrO_2$ increased the produced thin film changed its color from brownish to black color, and was suitable as the black thin insulator film.

FIG. 3 shows spectral distributions of transmittance of film-coated glass substrates. A curve 2 shows the spectral distribution of the transmittance of the black thin insulator film of Pr oxide of about 500 Å thickness formed by sputtering the Pr oxide target in an atmosphere at $3 \times 10^{-2}$ Torr. and Ar/$O_2$=1/1 on a glass substrate of a temperature of 200° C. A curve 3 shows the spectral distribution of the transmittance of the glass substrate whereon a Pr oxide black thin film of 2700 Å thickness is formed by sputtering in an atmosphere consisting of $O_2$ only, with other conditions the same as the case of the curve 2. Incidentally, a curve 1 shows a spectral distribution of transmittance of the glass substrate itself for comparison. The measurement to obtain the curves of FIG. 3 was carried out by using tungsten-halogen lamp. The Pr oxide thin film shows a continuous absorption characteristic along whole visible range, but the absorption is stronger in the shorter wavelength range. This thin film of 500 Å thickness absorbs about 65% of light of the wavelength of 5000 Å, but a thicker film of 2700 Å thickness absorbs substantially all the light except the small transmission in the range of the wavelength above 5500 Å, as shown by curve 3 of FIG. 3. That is, the Pr oxide black thin insulator film has suitable optical characteristic as light absorption film.

The film also has good electric characteristic such as specific resistance of the order of $10^9 \Omega$·cm and sheet resistance of over $10^8 \Omega/\square$ for a thickness of several thousand Å. Furthermore, it has dielectric constant of about 400 at 1 KHz and tan δ of about 2%. Such a high dielectric constant is a very desirable characteristic for producing a thin AC EL panel to be operated at a low driving voltage.

Almost the similar Pr oxide black thin insulator film could be made by EB evaporation method using metal Pr or $Pr_6O_{11}$ ceramic as the evaporation source. That is, the black thin insulator film of Pr oxide could be formed by carrying out an active evaporation in an oxidizing atmosphere of a pressure of the order of $10^{-4}$ Torr. Higher pressure and lower evaporation rate showed genrally a tendency to make the film more blackish. A temperature of substrate of about 200° C. was suitable for this process.

Next, manufacturing of black thin insulator film of Pr-Mn composite oxide is described. This composite oxide film could be made by radio-frequency sputtering method or DC sputtering method or EB evaporation method. Hereafter, preparation of the film of Pr-Mn composite oxide is elucidated using the radio-frequency sputtering method as one example, but other method can be done in similar way. The thin film of the Pr-Mn composite oxide could be made by using a sputtering target having Pr metal chip and Mn metal chip with an appropriate area ratio thereby to carry out the active sputtering in oxygen atmosphere; but more inexpensive way was to use a sputtering target prepared by mixing $Pr_6O_{11}$ oxide and $MnCO_3$ with appropriate mixing ratio to make a mixed powder, which was then fired at about 1000° C. and ground to powder, and then after pressing into a compact disk fired at a temperature of about 1380° C. for 2 hours to sinter into a ceramic target of about 5 mm thickness. The sintered ceramic target was evaporated by means of a magnetron sputtering apparatus onto a glass substrate, which was heated at a temperature of about 200° C., in Ar gas or $O_2$ gas, to form the black thin insulator film. Light absorption coefficients of the thin insulator film made by the above-mentioned sputtering in Ar gas of $3 \times 10^{-2}$ Torr. pressure were measured for various Pr/Mn atom ratios, and the measured light absorption coefficients are shown in Table 2.

TABLE 2

| No. | Composition of the target | Thickness of the thin film | Absorption coefficient (cm$^{-1}$) | |
| --- | --- | --- | --- | --- |
| | | | Wavelength 5000Å | Wavelength 6000Å |
| 1 | Mn oxide | 3450 | $1.1 \times 10^5$ | $6.3 \times 10^4$ |
| 2 | 0.25Pr0.75Mn oxide | 3500 | $1.2 \times 10^5$ | $7.9 \times 10^4$ |
| 3 | 0.52Pr0.48Mn oxide | 3850 | $1.25 \times 10^5$ | $6.6 \times 10^4$ |
| 4 | 0.65Pr0.35Mn oxide | 2450 | $1.0 \times 10^5$ | $5.0 \times 10^4$ |
| 5 | 0.76Pr0.24Mn oxide | 4100 | $7.4 \times 10^4$ | $3.6 \times 10^4$ |

As is obvious from the Table 2, at around the wavelength of 5000 Å wherein visibility is considerably high in the visible range, such a high absorption coefficient of $10^5$ cm$^{-1}$ which is comparable to fundamental absorptions of Si or GaAs is obtainable by the composite oxide containing 35 atom % or more of Mn or Mn oxide. Furthermore, in the shorter wavelength region, the absorption is generally larger. The composite oxide film of Pr-Mn which is formed in the pure Ar atmosphere showed good result as described above. Thus, it is considered that the Ar atmosphere is advantageous in avoiding decrease of deposition rate which is observed in an atmosphere containing $O_2$. However, $O_2$ may be included in the atmosphere; when the sputtering was made in an atmosphere of pure oxygen gas, in the case of sample No. 4 composition of the Table 2, the absorption coefficient at the wavelength of 5000 Å increased by about 40%, whereas the deposition rate decreased to about ¼ of the pure Ar atmosphere. The obtained thin insulator film shows brownish black color as Mn content becomes increases, while the color becomes yellowish brown when Pr content becomes dominant.

Figure 4:
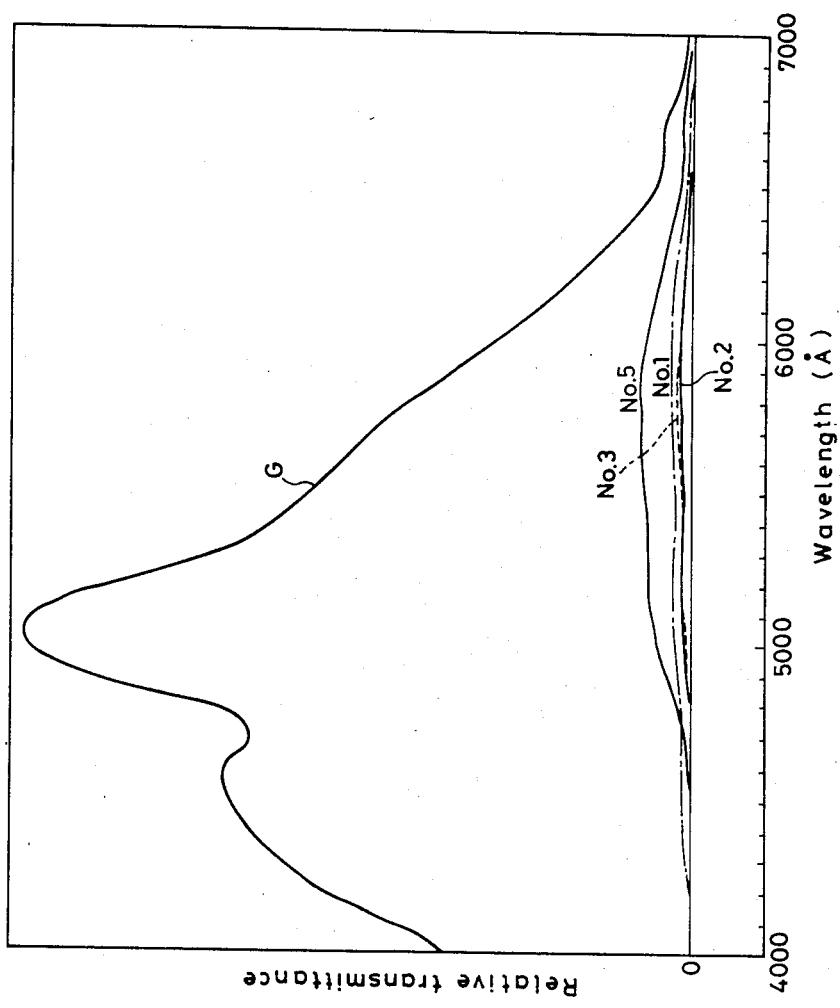
FIG. 4 is a graph of spectral distribution of light transmittance of Pr-Mn composite oxide thin insulator film.

FIG. 4 shows spectral distributions of light transmittance of some samples of the Table 2. Numbers pointing the curves designate the samples in the Table 2. A curve G shows spectral distribution of energy which transmit through a glass substrate of 0.8 mm thickness. By comparing with the curve G, it is apparent that the curves No. 1, No. 2, No. 3 and No. 5 substantially absorb almost energy of the light. That is, the black thin insulator films of these samples are very suitable as the black thin insulator films to be used in the thin film EL panel.

The above-mentioned black thin insulator films of composite oxide of Pr-Mn have good light absorption characteristics, particularly in the composition range of 35 atom % Mn and more, the absorption coefficient is above $10^5$ cm$^{-1}$ and appearance is more brownish black. The Mn oxide film also has the same good characteristics.

As a result of X-ray diffraction, a crystal phase of Mn oxide of the sample No. 1 of the Table 2 was confirmed to be $Mn_2O_3$. All of other samples of No. 2 to No. 5 showed broad halo patterns.

Figure 5:
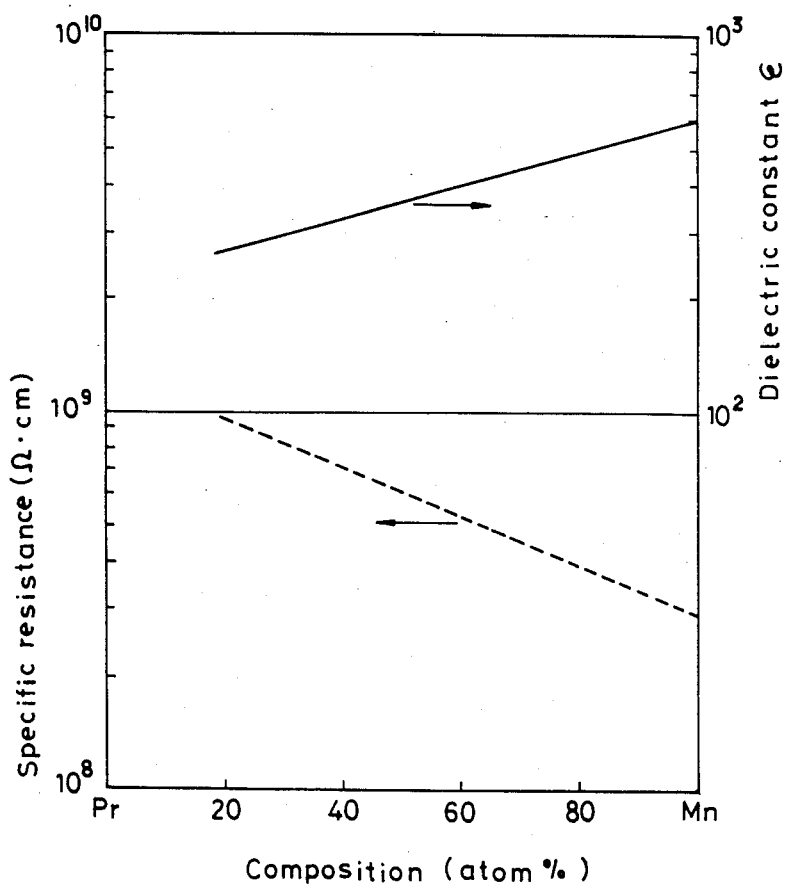
FIG. 5 is a graph showing relation between Pr/Mn ratio of the Pr-Mn composite oxide thin insulator film vs. specific resistance and dielectric constant.

Electrical characteristics were measured in a sandwich structure by forming aluminum electrode on one face of a glass substrate and thereon the black thin insulator film, and further thereon another aluminum electrode. FIG. 5 shows relation between composition ratio of Pr-Mn vs specific resistance $\rho$ and dielectric constant $\epsilon$. When Mn content is increased, the specific resistance $\rho$ becomes lower, and $\epsilon$ becomes higher. The black thin insulator film of the embodiment shows the specific resistance $\rho$ of $3-8 \times 10^8 \Omega \cdot$cm and the dielectric constant $\epsilon$ of 300-600 within the composition range of Mn of 35-100 atom %. The sheet resistance $R_\square$, specific resistance $\rho$ and thickness of the thin film t hold a relation:

$$R_\square = \rho/t \ (\Omega/\square) \qquad (1).$$

In the equation, when t=4000 Å and $\rho = 3 \times 10^8 \Omega \cdot$cm, the sheet resistance $R_\square$ becomes $R_\square = 7.5 \times 10^{12} \Omega/\square$, which is satisfactorily high. Besides, the dielectric constant $\epsilon$ is satisfactorily high in comparison with that of ZnS, and therefore the thin film EL panel can be operated with a reasonable low voltage.

Figure 6:
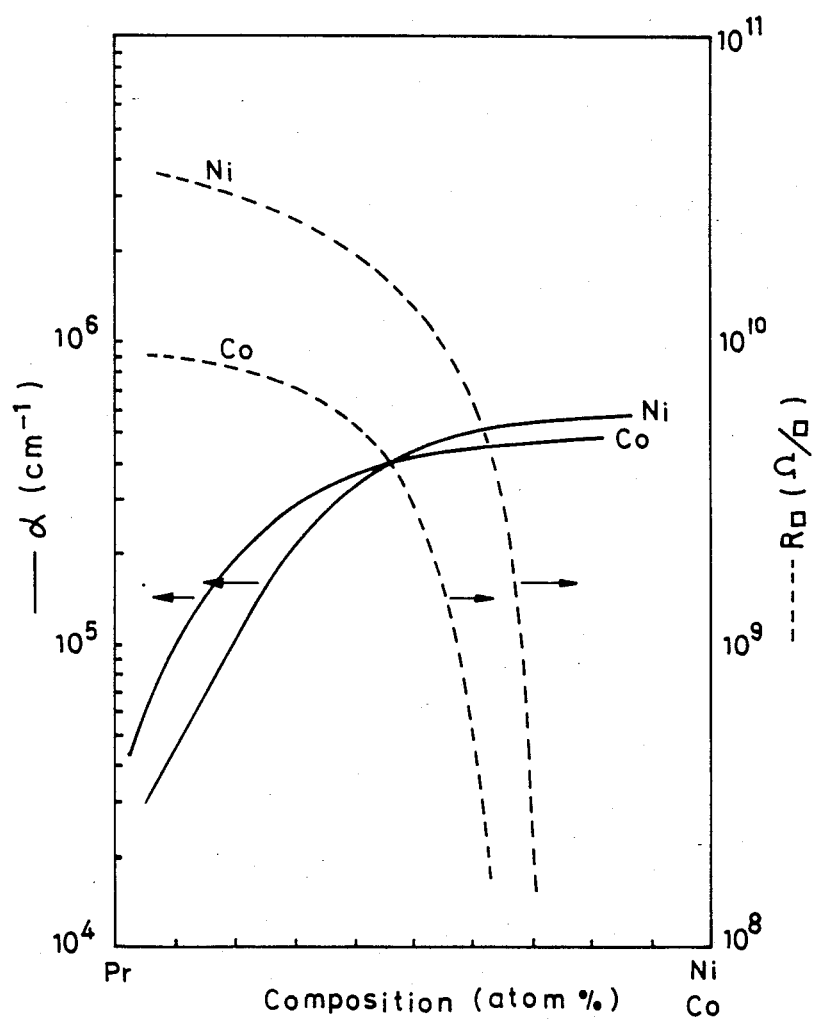
FIG. 6 is a graph showing relation between Pr/Ni ratio and Pr/Co ratio vs. light absorption coefficient $\alpha$ at a wavelength of 5000 Å shown by solid curves and sheet resistance $R\square$ drawn by dotted lines.

Next, thin insulator films of composite oxide of Pr-Ni and opposite oxides of Pr-Co could be formed in the similar method as that of the above-mentioned composite oxide of Pr-Mn. The targets were made by changing atom ratios in Pr-Ni or Pr-Co and used for sputtering in Ar atmosphere of $3 \times 10^{-2}$ Torr. to form the thin insulator film. And then, light absorption coefficient for the wavelength of 5000 Å and sheet resistance of the film of 4000 Å thickness were measured, and the results are shown in a graph of FIG. 6. As shown by the curves of FIG. 6, for the light of wavelength of 5000 Å which has relatively high visibility in the visible range a large absorption coefficient of the order of $10^5$ cm$^{-1}$ and a large sheet resistance of above $10^8 \Omega/\square$ were obtained, when Ni of the composite oxide of Pr-Ni was 20-70 atom % and when Co of Pr-Co was 10-60 atom %. The obtained thin insulator films show more black appearance as the contents of Ni or Co increases. As the content of Pr increases, the color becomes yellowish black, and X-ray diffraction measurement confirms that within the component range described above the peaks are halo patterns.

Table 3 shows characteristics of embodiment thin film EL panels made by using the black thin insulator films prepared in the above-mentioned process. That is, the Table 3 shows structure, threshold voltage, brightness and contrast of the EL panels embodying the present invention. In Table 3, ITO means transparent electrode of solid solution oxide of In and Sn. ST means dielectric thin film of $SrTiO_3$ of 6000 Å thickness. ZSM means ZnS:Mn (0.8 atm %) phosphor thin film of 4500 Å. PrO means Pr oxide, which is, exactly speaking, $Pr_6O_{11} + PrO_2$. $Pr_{1-x}Mn_xO$ means composite oxides of various component ratios of Pr and Mn. MnO is, in exact expression, $Mn_2O_3$. PrNiO and PrCoO are composite oxide of Pr and Ni or Pr and Co, wherein atom ratios are 1:1. Al at the last part of each structure means aluminum back electrode 6 shown in FIG. 1 and FIG. 2. The figures in the parenthesis show the thicknesses of the films.

The films of $SrTiO_3$ and $BaTa_2O_6$ were formed by using ceramic targets in a radio-frequency magnetron sputtering method in an atmosphere of mixed gas of Ar and $O_2$. ZnS:Mn phosphor and Al electrode were formed by EB evaporation method. $Y_2O_3$ insulator film was made by using Y metal as evaporation source in an active EB evaporation method. With respect to forming of the black thin insulator oxide films, PrO (Pr oxide) was prepared by using oxide target in a radio-frequency magnetron sputtering method in the mixed gas of $O_2$/Ar=1/1, and other black thin insulator films than PrO were made by the similar method in pure Ar gas atmosphere.

The brightness was measured by applying AC pulses of 60 Hz and 30$\mu$ sec pulse width across the electrodes 2 and 6 in a manner that electric charge density of 1.8 $\mu$c/cm$^2$ per half cycle was given to the phosphor film.

Such electric charge density almost corresponds to the actual driving condition of EL. The contrast was measured as a ratio of brightnesses when the EL panel face was of an illumination of 400 lux, and thereunder the light emitting segment was on and off.

TABLE 3

| No. | Structure of the panel | Threshold voltage Vo-p | Brightness nit | Contrast |
|---|---|---|---|---|
| 1 | ITO/ST/ZSM/$Y_2O_3$(2500)/Al | 130 | 100 | 2.2:1 |
| 2 | ITO/ST/ZSM/PrO(2500)/Al | 85 | 55 | 6.5:1 |
| 3 | ITO/ST/ZSM/PrO(2000)/$BaTa_2O_6$(500) | 95 | 61 | 6.0:1 |
| 4 | ITO/ST/ZSM/$Y_2O_3$(500)/PrO(2000)/Al | 100 | 64 | 5.7:1 |
| 5 | ITO/ST/ZSM/$Y_2O_3$(500)/$Pr_{0.65}Mn_{0.35}O$(4000)/Al | 105 | 60 | 6.2:1 |
| 6 | ITO/ST/ZSM/$Y_2O_3$(500)/$Pr_{0.52}Mn_{0.48}O$(4000)/Al | 102 | 55 | 6.4:1 |
| 7 | ITO/ST/ZSM/$Y_2O_3$(500)/MnO(4000)/Al | 97 | 54 | 6.0:1 |
| 8 | ITO/ST/ZSM/$Pr_{0.52}Mn_{0.48}O$(4500)/Al | 90 | 51 | 6.4:1 |
| 9 | ITO/ST/ZSM/$Y_2O_3$(500)/PrNiO(4000)/Al | 100 | 50 | 6.7:1 |
| 10 | ITO/ST/ZSM/PrNiO(4500)/Al | 87 | 47 | 7.0:1 |
| 11 | ITO/ST/ZSM/$Y_2O_3$(500)/PrCoO(4000)/Al | 97 | 50 | 6.5:1 |
| 12 | ITO/ST/ZSM/PrCoO(4500)/Al | 85 | 48 | 6.8:1 |

As is apparent from the Table 3, by using the black oxide thin insulator films in accordance with the present invention as at least a part or all of the upper or second insulator film of the EL panel, a thin film EL panel having very good contrast and operable at low driving voltage is obtainable. Although, the brightness of the EL panel is decreased slightly due to the emission light absorption by the black thin film, the high contrast obtained by use of the black thin film much more improve the overall clarity of display. Furthermore the EL panel with the black thin insulator film of the present invention has very stable characteristic, such that even after 3000 hours of operation, no deterioration of brightness nor breakdown damage of insulation was found. As a result, a solid state thin film EL panel having features of compactness, light weight, good viewing capability is provided.

What is claimed is:

1. A thin film EL panel comprising:
  a transparent electrode film,
  a phosphor film formed above said transparent electrode film,
  a thin insulator film formed on said phosphor film and at least a part thereof is a thin film of an oxide selected from the group consisting of (i) Pr oxides wherein said thin film of Pr oxides is a sputtered film or an evaporated film, (ii) composite oxides of Pr—Mn wherein said thin film said Pr—Mn composite oxides have a Pr/Pr+Mn atom ratio of at least 0.35, (iii) composite oxides of Pr—Co wherein said thin film said Pr—Co composite oxides have a Pr/Pr+Co atom ratio of ranging from 0.1 to 0.6, and (iv) composite oxides of Pr—Ni wherein said thin film said Pr—Ni composite oxides have a Pr/Pr+Ni atom ratio ranging from 0.2 to 0.7
  a back electrode formed on said thin insulator film.

2. A thin film El panel according to claim 1 wherein said oxides is a composite oxide of Pr.

3. A thin film EL panel according to claim 1 wherein said oxides are composite oxides of Pr—Ni.

4. A thin film EL panel according to claim 1 wherein said oxides are composite oxides of Pr—Co.

5. A thin film EL panel according to claim 1 wherein said oxides are composite oxides of Pr—Mn.

6. A thin film EL panel according to claim 1 wherein said oxides are composite oxides of $Pr_6O_{11}$ and $PrO_2$.

* * * * *